US011121043B2

(12) United States Patent
Posseme et al.

(10) Patent No.: US 11,121,043 B2
(45) Date of Patent: Sep. 14, 2021

(54) FABRICATION OF TRANSISTORS HAVING STRESSED CHANNELS

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Cyrille Le Royer, Tullins-Fures (FR); Yves Morand, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/230,192

(22) Filed: Dec. 21, 2018

(65) Prior Publication Data

US 2019/0244869 A1   Aug. 8, 2019

(30) Foreign Application Priority Data

Dec. 22, 2017   (FR) .................................... 17 63190

(51) Int. Cl.
*H01L 21/8238* (2006.01)
*H01L 29/80* (2006.01)
(Continued)

(52) U.S. Cl.
CPC .......... *H01L 21/84* (2013.01); *C23C 14/0652* (2013.01); *C23C 14/48* (2013.01);
(Continued)

(58) Field of Classification Search
CPC ......... H01L 29/7833; H01L 2924/0002; H01L 2924/00; H01L 21/823857; H01L 29/51; H01L 29/6659; H01L 29/665
See application file for complete search history.

(56) References Cited

U.S. PATENT DOCUMENTS

2005/0263825 A1   12/2005  Frohberg et al.
2005/0266639 A1*  12/2005  Frohberg ........ H01L 21/823807
                                                         438/257
(Continued)

FOREIGN PATENT DOCUMENTS

CN          103646954         3/2014

OTHER PUBLICATIONS

French Preliminary Search Report dated Aug. 28, 2018 in French Application 17 63190 filed on Dec. 22, 2017 (with English Translation of Categories of Cited Documents).
(Continued)

*Primary Examiner* — Brian Turner
(74) *Attorney, Agent, or Firm* — Oblon, McClelland, Maier & Neustadt, L.L.P.

(57) ABSTRACT

There is provided a method for producing, on one same wafer, at least one first transistor surmounted at least partially on a voltage stressed layer and a second transistor surmounted at least partially on a compression stressed layer, the method including providing a wafer including the first and the second transistors; forming at least one stressed nitride-based layer, on the first and the second transistors, the layer being voltage stressed; depositing a protective layer so as to cover a first zone of the layer, the first zone covering at least partially the first transistor and leaving a second zone of the layer uncovered, the second zone at least partially covering the second transistor; and modifying a type of stress of the second zone of the layer by implanting hydrogen-based ions from a plasma in the second zone, such that the second zone of the layer is compression stressed.

21 Claims, 4 Drawing Sheets

(51) Int. Cl.
  *H01L 21/84*    (2006.01)
  *H01L 29/78*    (2006.01)
  *C23C 14/06*    (2006.01)
  *C23C 14/48*    (2006.01)
  *C23C 16/34*    (2006.01)
  *C23C 28/04*    (2006.01)
  *H01L 21/02*    (2006.01)
  *H01L 21/223*   (2006.01)
  *H01L 21/3115*  (2006.01)

(52) U.S. Cl.
  CPC ............ *C23C 16/345* (2013.01); *C23C 28/04* (2013.01); *H01L 21/0217* (2013.01); *H01L 21/0234* (2013.01); *H01L 21/02118* (2013.01); *H01L 21/02271* (2013.01); *H01L 21/02321* (2013.01); *H01L 21/2236* (2013.01); *H01L 21/31155* (2013.01); *H01L 21/823807* (2013.01); *H01L 29/7843* (2013.01)

(56) References Cited

U.S. PATENT DOCUMENTS

| | | |
|---|---|---|
| 2006/0151843 A1 | 7/2006 | Yang et al. |
| 2006/0157795 A1 | 7/2006 | Chen et al. |
| 2007/0042580 A1* | 2/2007 | Al-Bayati ......... H01L 21/02203 438/530 |
| 2007/0105297 A1* | 5/2007 | Jeong ................. H01L 29/7843 438/197 |
| 2008/0044960 A1* | 2/2008 | Al-Bayati ............. H01J 37/321 438/156 |
| 2008/0070357 A1 | 3/2008 | Chen et al. |
| 2008/0085607 A1 | 4/2008 | Yu et al. |
| 2008/0128834 A1 | 6/2008 | Yang et al. |
| 2008/0251853 A1 | 10/2008 | Chen et al. |
| 2010/0012991 A1* | 1/2010 | Owada ................. C23C 16/345 257/288 |
| 2010/0171180 A1* | 7/2010 | Zhang ................ H01L 29/4958 257/369 |
| 2011/0049641 A1* | 3/2011 | Hoentschel ..... H01L 21/823412 257/369 |
| 2012/0199913 A1 | 8/2012 | Murata et al. |
| 2012/0315760 A1* | 12/2012 | Yu .................... H01L 21/823807 438/682 |
| 2013/0032888 A1 | 2/2013 | Murata |
| 2014/0175557 A1 | 6/2014 | Murata |
| 2017/0338157 A1 | 11/2017 | Posseme et al. |
| 2018/0061839 A1* | 3/2018 | Baars .................... H01L 23/485 |

OTHER PUBLICATIONS

Extended European Search Report dated Feb. 27, 2019 in Patent Application No. 18215785.9, citing documents AA-AC therein, 11 pages (with English translation of categories of cited documents).

* cited by examiner

FABRICATION OF TRANSISTORS HAVING STRESSED CHANNELS

FIELD

The present invention relates to the production of MOS (metal oxide semi-conductive)-type transistors having a constrained channel. It will have an advantageous, but not limiting application in the production of such transistors on an FDSOI-type substrate.

TECHNOLOGICAL BACKGROUND

Reducing the size and increasing the speed of microelectronic circuits require controlling, with a great precision, the control current of the transistors. The control if current in particular depends on the length of the gate, on the capacitance of the gate and on the mobility of the charge carriers in the channel. Thus, various solutions have been proposed to reduce the length of the gate, to increase the capacitance of the gate and to increase the mobility of the charge carriers in the channel of the transistor.

Among the solutions explored to increase the mobility of the charge carriers, one consists of introducing a mechanical stress in the channel. More specifically, the performances of NMOS-type transistors are improved by applying a tensile stress in the channel, this tensile stress making it possible to increase the mobility of the electrons. The performances of PMOS-type transistors are improved by applying a compression stress in the channel, this stress making it possible to increase the mobility of the holes.

FIG. 1 illustrates a portion of a wafer comprising:
an NMOS-type transistor 100 covered by a tensile stressed layer 190, and
an NMOS-type transistor 200 covered by a compression stressed layer 290.

FIGS. 2a to 2f illustrate the conventional solution to produce this structure type.

As illustrated in FIG. 2a, after production of the NMOS 100 and PMOS 200 transistors on one same wafer, the PMOS-type transistors 200 are protected, and NMOS-type transistors 100 are left to be uncovered. As illustrated in FIG. 2b, the NMOS transistors 100 are then covered by a tensile stressed layer. The protection of PMOS-type transistors is then removed as illustrated in FIG. 2c, NMOS-type transistors 200 themselves are protected and PMOS-type transistors 200 are left to be uncovered, as is illustrated in FIG. 2d. As illustrated in FIG. 2e, the PMOS transistors 200 are then covered by a compression stressed layer. The protective layer covering the NMOS transistors 100 is then removed to result in the structure illustrated in FIG. 2f.

Another manner of proceeding consists of depositing a solid wafer tensile stressed layer, then of removing this layer, only on PMOS-type transistors by carrying out conventional photolithography steps. Then, a compression stressed layer is solid wafer deposited. This compression stressed layer therefore covers PMOS and NMOS transistors. The final step consists of removing this compression stressed layer only on NMOS-type transistors by carrying out conventional photolithography steps.

This production method has proved to be, in practice, relatively long and complex.

There is therefore a need, consisting of proposing a solution to facilitate the obtaining, on a wafer, of a tensile stressed layer on a first type of pattern and of a compression stressed layer on another type of pattern.

Other aims, characteristics and advantages of the present invention will appear upon examining the following description and the supporting drawings. It is understood that other advantages can be incorporated.

SUMMARY OF THE INVENTION

To achieve this aim, according to an embodiment, a method for producing, preferably a first transistor is provided, surmounted at least partially on a tensile stressed layer and a second pattern, preferably a second transistor, surmounted at least partially on a compression stressed layer.

The productions of tensile and compression stressed layers comprise the following steps:
Providing a wafer comprising at least one first pattern and one second pattern,
Forming at least one stressed layer covering the first pattern and the second pattern, the stressed layer deposited having a tensile stress,
Depositing a protective layer so as to cover a first zone of the stressed layer, the first zone partially, and preferably fully covering only one from among the first and the second patterns and to leave a second zone of the stressed layer to be uncovered, the second zone partially, and preferably fully covering at least the other from among the first and the second patterns,
Modifying, of the stressed type, of the second zone of the stressed layer, by implanting hydrogen-based ions from a plasma in the second zone, such that the second zone of the stressed layer has a compression stress.

Thus, this method makes it possible to form a tensile stressed layer on a first pattern is a compression stressed layer on a second pattern. When these patterns are transistors, the stressed layers make it possible to tensile and compression stress the channel of each of the transistors improving, due to this, the mobility of the charge carriers.

This method has a considerably reduced number of steps, with respect to the conventional solutions mentioned above and illustrated in FIGS. 2a to 2f. The claimed method therefore makes it possible to increase the reliability and to reduce the production costs.

According to an advantageous embodiment, the first and the second patterns are transistors which have different characteristics. For example, they can have different dopings. Thus, according to an example, the first pattern and the second pattern are transistors, preferably respectively of NMOS and PMOS-type.

Alternatively or in combination, the first transistor and the second transistor can have different gate oxide thicknesses.

Alternatively or in combination, the first transistor and the second transistor can have different channel thicknesses.

In the scope of the development of the present invention, it has been considered to deposit a tensile stressed layer covering both NMOS-type and PMOS-type transistors, then to protect NMOS-type transistors, then to apply an additional treatment step to invert the stress in the layer covering the PMOS transistors, this additional treatment step mainly consisting of an ultraviolet, laser or electron beam (e-Beam) treatment.

The application of an ultraviolet treatment with a power of between 300 W/m$^2$ and 2000 W/m$^2$, combined with a heat treatment carrying the temperature of the substrate to a temperature of a few tens even hundreds of degrees, seems to be able to make it possible to pass from a tensile stress to compression stress. However, this treatment type requires a long duration, typically from a few minutes to a few tens of minutes, which is not compatible with industrial productivity constraints.

Moreover, methods which would make an implantation intervene in the heavy on stressed layer would have several disadvantages. In particular, this implantation would risk altering the layer underlying the stressed layer when the latter is relatively thin. The performances of the transistor would be immediately degraded. Moreover, the implantation of heavy ions would consequently alter the geometry and the dimensions of the protective blocks covering NMOS-type transistors. Typically, when these protective blocks are made of resin, the implantation of heavy ions would lead to a certain creeping of these protective blocks. This would degrade the quality of the interface between the protected stressed layer and the unprotected layer. A weak controlling of the interface between the tensile stressed layer and the compression stressed layer would result from this.

It has therefore been proved to be, that these types of solutions have numerous disadvantages.

The claimed method reduces, even removes these disadvantages.

BRIEF DESCRIPTION OF THE FIGURES

The aims, objectives, as well as the characteristics and advantages of the invention will emerge best from the detailed description of embodiments of the latter which are illustrated by the following supporting drawings, wherein:

FIG. 2, comprising

FIG. 3, comprising

Figure 1:
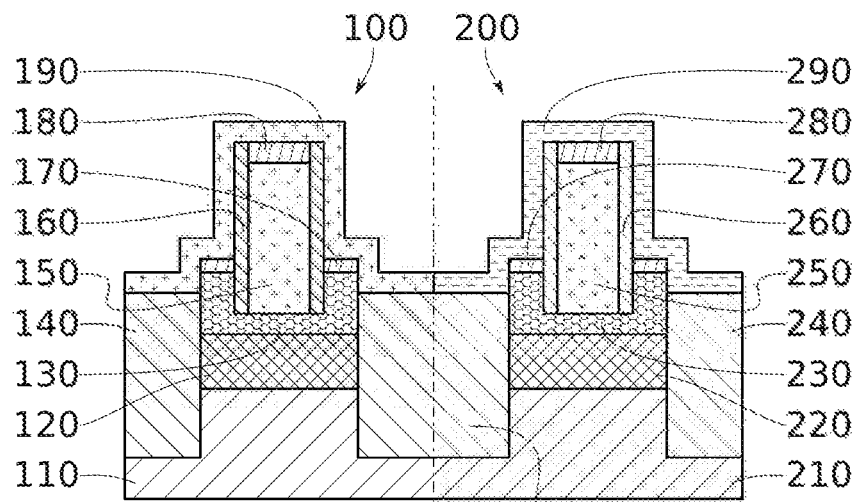
FIG. 1 is a structure comprising an NMOS-type transistor covered by a tensile stressed layer and a PMOS-type transistor covered by a compression stressed layer.
Figure 2A:
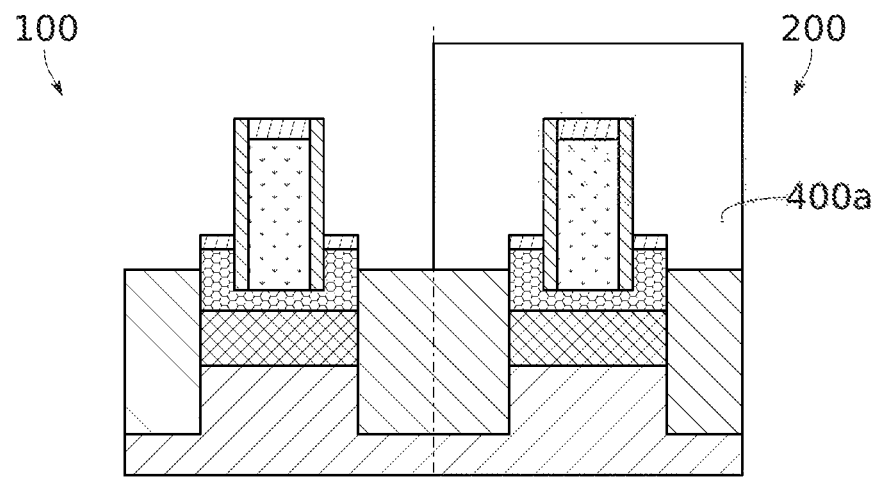
FIGS. 2a to 2f, illustrates different steps of a method of the state of the art.
Figure 2B:
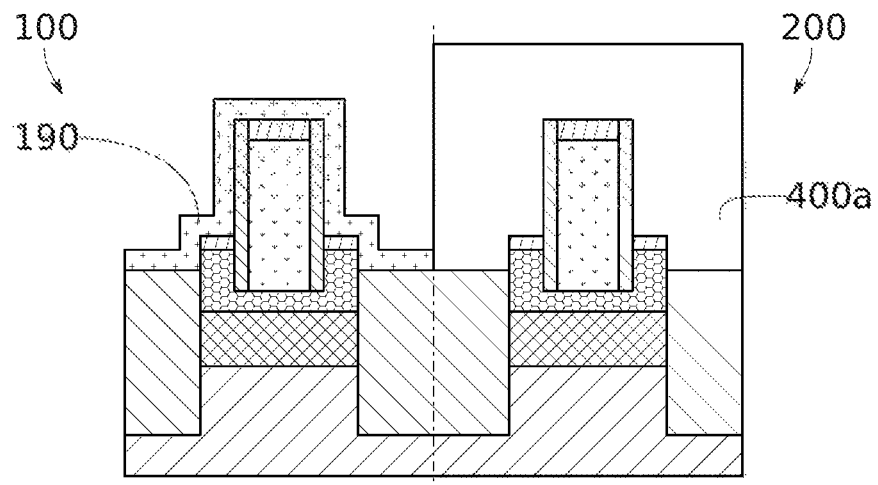
Figure 2C:
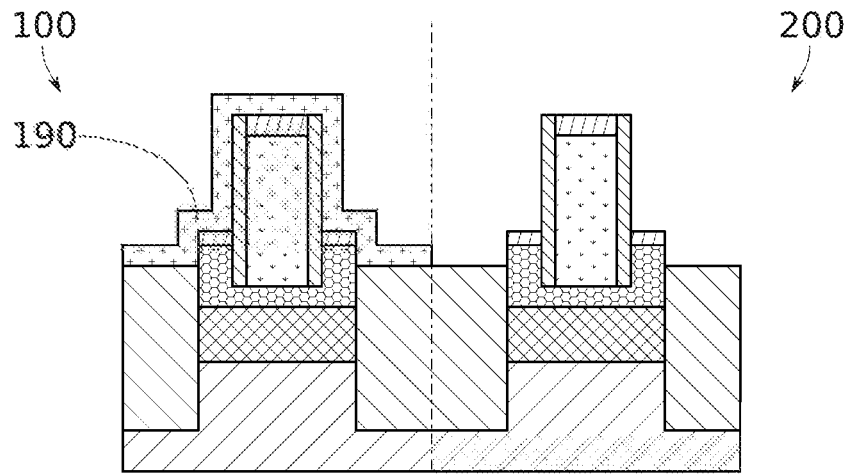
Figure 2D:
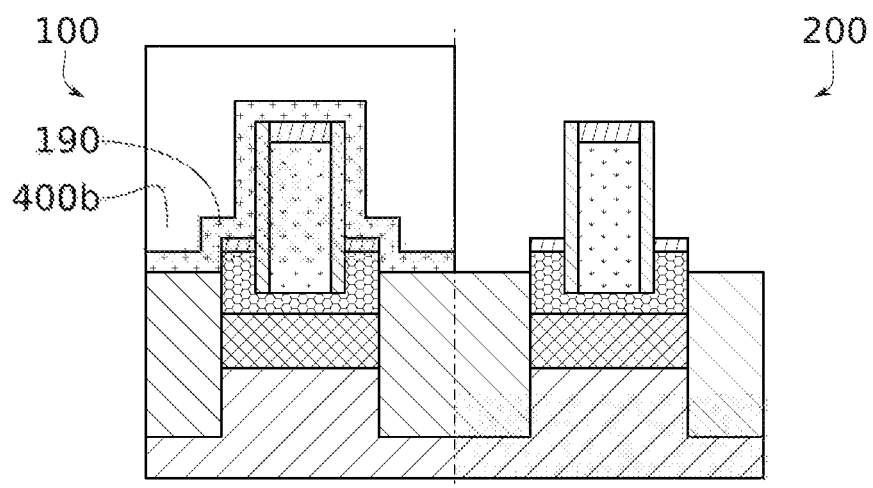
Figure 2E:
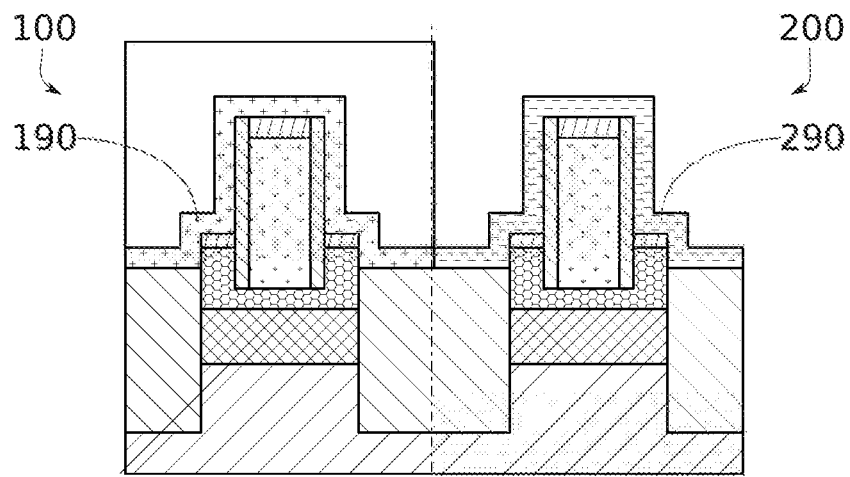
Figure 2F:
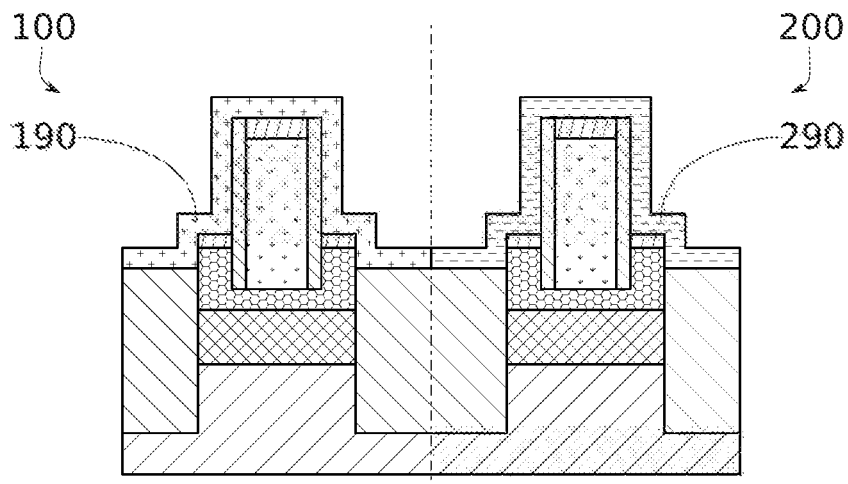

The drawings are given as examples, and are not limiting of the invention. They constitute schematic representations of principle intended to facilitate the understanding of the invention and are not necessarily to the scale of practical applications. In particular, the relative thicknesses of the different layers and films are not representative of reality.

DETAILED DESCRIPTION OF THE INVENTION

Before starting a detailed review of embodiments of the invention, optional characteristics are stated below, which can possibly be used in association or alternatively:

According to an example, the tensile stressed layer and the compression stressed layer are preferably nitride-based layers and preferably made of nitride. Preferably, these layers are silicon nitride $Si_xN_y$ layers, x and y being whole numbers. Preferably, this is SiN, $SiN_3$, $Si_2N_4$.

According to an example, the first zone fully covers the first pattern forming a transistor and the second zone fully covers the second pattern forming a transistor.

All the following characteristics can be generalised in the case where a transistor is a pattern.

According to an example, an electrical insulation trench separates the first transistor and the second transistor. The first and the second zones each extend until the insulation trench. Preferably, an interface defined by the first and the second zones is at least partially facing to the insulation trench. This means that the flank of the protective layer (which defines the delimitation between tensile stressed layer and compression stressed layer) is situated on the insulation trench.

According to an example, the deposition of the protective layer is done so as to cover one part at least of the first NMOS-type transistor, and preferably all of the first NMOS-type transistor, and to fully leave the second PMOS-type transistor to be uncovered.

According to an example, the first transistor and the stressed layer are shaped so as to tensile stress at least one channel of the first transistor.

According to an example, the second transistor and the stressed layer are shaped so as to compression stress at least one channel of the second transistor.

According to an example, the plasma is formed from a mixture comprising $H_2$.

According to an example, the parameters of the plasma, in particular the type and the energy of the ions, are adjusted such that the implantation of ions reduces the thickness of the stressed layer in the second zone. This makes it possible, for example, to best control the thickness of the stressed layer of the second zone.

According to an example, the plasma is formed from a mixture comprising at least one of the following gases: HBr, $NH_3$.

An advantage of this chemistry is that during the modification of the uncovered stressed layer, the thickness of the latter can be reduced by the bombardment of species heavier than hydrogen (for example, Br and N species) present in the plasma.

This makes it possible to adjust the thickness of the stressed layer.

This better controlling of the thickness of the stressed layer provides, for example, as an advantage, that the thickness of the stressed layers surmounting all the sources and drains, whichever the transistors, has the same thickness on the surface of the wafer. During the etching of this layer to open the contacts to make electrical recoveries, the sources and drains will therefore be reached at the same time.

Moreover, this makes it possible to avoid possible short-circuits between the active zones of adjacent transistors.

According to an example, the plasma is formed from a mixture comprising at least one gas of $C_xH_y$ type, x and y being whole numbers and preferably another gas, for example, helium (He) and/or argon (Ar).

An advantage of this chemistry is that during the modification of the uncovered stressed layer, the thickness of the latter can be reduced by the bombardment of species heavier than hydrogen (for example, the species He and Ar) present in the plasma.

This makes it possible to adjust the thickness of the stressed layer, with for example, the advantages mentioned above.

Moreover, this chemistry makes it possible to reduce the consumption of the protective layer, in particular when the latter is carbonaceous. Such is the case when the protective layer is a photosensitive or thermosensitive resin.

In this case, carbon atoms, coming from the dissociation of $C_xH_y$ molecules, are deposited on the resin which protects it from the bombardment of other ions (argon or helium, for example) during the plasma implantation. The resin thus conserves, during all the implantation, the dimensions thereof and the geometry thereof.

This embodiment thus makes it possible to have a particularly high dimensional control at the interface between the first and the second transistors.

According to an example, the formation of the stressed layer is done such that the stressed layer has a thickness of between 2 and 50 nm (10-metres), preferably between 5 and 40 nm.

Advantageously, the modification step of the stressed type of the second zone of the stressed layer is carried out at a temperature less than 150° C. More specifically, the implantation is done at a temperature $T \leq 150°$ C., preferably $T \leq 130°$ C. and preferably $T \leq 100°$ C. Preferably, T is between 10° C. and 100° C. Particularly advantageously, the method is not based on the increase in temperature of the stressed layer to relax it.

According to an example, the formation of the stressed layer comprises a deposition, preferably conform.

According to an example, the conform deposition is done by one of the following depositions: plasma-enhanced chemical vapour deposition (PECVD), low-pressure enhanced chemical vapour deposition (LPCVD), rapid thermal chemical vapour deposition (RTCVD), physical vapour deposition (PVD).

According to an example, the parameters of the implantation, in particular the energy of the hydrogen-based ions, are selected so as to modify, by implanting all the thickness of the second zone of the stressed layer.

According to an example, the parameters of the implantation, in particular the energy of the hydrogen-based ions, are selected so as to modify, by implanting the uncovered stressed layer continuously, from the surface of the stressed layer and until a depth of around 40 nm (10-metres).

According to an example, the implantation is done at a temperature $\leq 150°$ C., preferably $\leq 130°$ C.

According to an example, the method comprises, after the modification step, a step of removing the protective layer.

According to an example, the method comprises a plurality of sequences, each sequence being applied on said first and second transistors, each sequence comprising successively at least: said step of depositing a stressed layer, said step of depositing a protective layer and said modification step. Thus, the stressed layer is formed by successive depositions. These depositions are stacked on top of one another. Each sequence is applied on one same zone of the wafer.

This embodiment makes it possible to also increase the precision of the modification of the stressed layer, which ultimately makes it possible to improve the precision of the stress imposed in the channel.

According to an example, at each sequence, said step of depositing a stressed layer is configured such that the thickness of the deposited stressed layer is less than 30 nm, preferably less than 20 nm and preferably of between 5 nm and 15 nm.

According to an example, the first and second transistors each have a channel formed in a semi-conductive layer, the semi-conductive layer surmounting a dielectric layer and a support substrate. The semi-conductive layer, the dielectric layer and the support substrate form a semi-conductive on insulator-type substrate.

According to an example; the first and second transistors are formed on an FDSOI-type substrate.

According to an example, the first and second transistors are formed on a PDSOI-type substrate.

According to an example, the hydrogen (H)-based ions are preferably taken from among the following ions: H, $H^+$, $H_2^+$, $H_3^+$.

It is specified that, in the scope of the present invention, the terms "on", "surmount", "cover", "underlying", "opposite" and the equivalents thereof do not necessarily mean "in contact with". Thus, for example, the deposition, the extension, the binding, the assembly, or the application of a first layer on a second layer, does not compulsorily mean that the two layers are directly in contact with one of the other, but means that the first layer covers at least partially the second by being either directly in contact with it, or by being separated by it, by at least one other layer or at least one other element.

A layer can moreover be composed of several sublayers of one same material or of different materials.

A substrate, a film, a material A-"based" layer, mean a substrate, a film, a layer comprising this material A only or this material A and possibly other materials, for example doping elements.

The word "dielectric" qualifies a material of which the electrical conductivity is sufficiently low in the given application to be used as an insulator.

In the scope of the present invention, an organic or organo-mineral material which could be shaped by an exposure to an electron, photon or X-ray beam, or mechanically, is qualified as a resin.

As an example, resins conventionally used in microelectronics, polystyrene (PS)-based resins, methacrylate (for example, Polymethyl methacrylate PMMA), Hydrogen silsesquioxane (HSQ), polyhydroxy styrene (PHS), etc. can be cited. The interest of using a resin is that it is easy to deposit a significant thickness of it, from several hundred nanometres to several microns.

It is specified that in the scope of the present invention, the thickness of a layer or the substrate is measured along a direction perpendicular to the surface according to which this layer or this substrate has the maximum extension thereof. In the figures, the thickness is taken along the vertical.

When it is indicated that an element is facing to another element, this means that these two elements are both situated on one same line perpendicular to the main plane of the substrate, or on one same line oriented vertically in the figures.

In the present patent application, a doping referenced P comprises all dopings by positive charge carriers (holes), whatever the content of the doping. Thus, a doping P comprises doping P+ contents and doping P contents less than the P+ type doping. Likewise, a doping referenced N comprises all dopings by negative charge carriers, whatever the content of the doping. Thus, a doping N comprises doping N+ contents, and doping N contents less than the N+ type doping.

Conventionally, a doping referenced P+ means that it is a P-type doping (doping by positive charges) and of which the doping species content is greater than or equal to 1 atom of the doping species for less than 500 atoms of the semi-conductor and preferably for less than 10 to 100 atoms of the material forming the semi-conductive layer. Likewise, an N+ doping means that it is an N-type doping (doping by negative charges) and of which the doping species content is greater than or equal to 1 atom of the doping species for less than 500 atoms of the semi-conductor and preferably for less than 10 to 100 atoms of the material forming the semi-conductive layer.

Figure 3A:
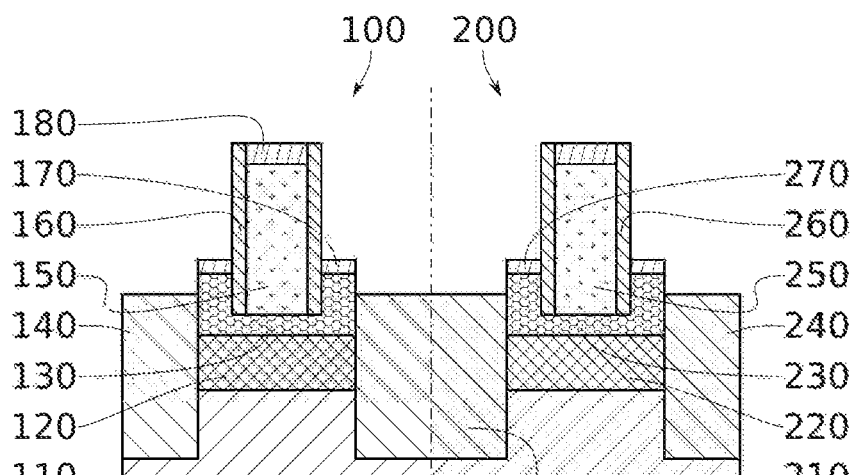
FIGS. 3a to 3e, illustrates different steps of a method according to a non-limiting example of the invention.

FIG. 3a illustrates a non-limiting example of structure from which the claimed method can be implemented.

This structure comprises a first pattern, in this example, a first transistor 100 and a second pattern, in this example, a second transistor 200. In this non-limiting example, the first transistor 100 is of NMOS-type and the second transistor 200 is of PMOS-type.

Each transistor 100, 200 comprises for example:
- an active layer 130, 230 forming a channel. This channel is made of a semi-conductive material. It is typically a silicon-based material such as silicon—(Si) or silicon-germanium (SiGe);
- a gate stack comprising, in particular, a gate 150, 250 usually made of doped silicon or made of metal, a metal layer and an electrically insulating layer called gate oxide situated between the active layer and the polycrystalline silicon gate. The gate stack can also comprise a dielectric layer called "high-k", i.e. made of a material with high permittivity. When it is present, this dielectric layer is situated between the gate oxide and the metal gate.
- The gate stack also comprises a re-contact 180, 280. This re-contact 180 is situated on the top of the gate stack in order to make it possible for it to have the electrical connection with other parts of the circuit. The re-contact is formed in a conductive material. Typically, it is produced by silicidation.
- In FIG. 3a, for reasons of clarity and concision, only the gate 150, 250 and the re-contact 180, 280 are illustrated,
- preferably spacers which cover the flanks of the gate stack. Typically, these spacers are formed in materials having a low dielectric constant. They can be porous or not. They are, for example, formed in one of the following materials: SiCO, SiC, SiCN, SiOCN or SiCBN, or a silicon nitride (SixNy, x and y being whole numbers).
- source and drain zones formed by the active layer 130, 230 (or by epitaxy from the latter) and arranged on either side of the channel
- Re-contacts 170, 270 for the electrical connection of the source and drain zones. These re-contacts 170, 270 are formed of conductive material and are preferably formed by silicidation.

The active layer 130, 230 of each transistor 100, 200 surmounts an electrically insulating layer 120. Preferably, it all is supported by a support substrate 110.

Preferably, the support substrate 110, the insulating layer 120 and the active layer 130 form a substrate developed of silicon on insulator (SOI)-type, or more generally, semi-conductor on insulator-type. The insulating layer 120 is thus qualified as a buried oxide (BOX) layer. The active layer 130 is preferably very thin.

These developed substrates 100 are qualified as FDSOI (fully depleted silicon on insulator, or more generally fully depleted semi-conductor on insulator) or PDSOI (partially depleted silicon on insulator, or more generally partially depleted semi-conductor on insulator) mainly according to the thickness of the semi-conductive active layer 130, 230.

The structure illustrated in FIG. 3a also shows the presence of insulation trenches 140, 240 passing through the whole active layer 130, 230 to insulate two transistors 100, 200. These insulation trenches 140, 300, 240 extend through all the thickness of the active layer 130, 230 and up to in the support substrate 110. These insulation trenches 140, 300, 240 are typically made of oxide, typically made of $SiO_2$.

FIGS. 3b to 3e illustrates the main steps of forming tensile and compression stressed layers on the transistors 100 and 200. Naturally, this method can be applied to structures, different to those illustrated in FIG. 3a.

Figure 3B:
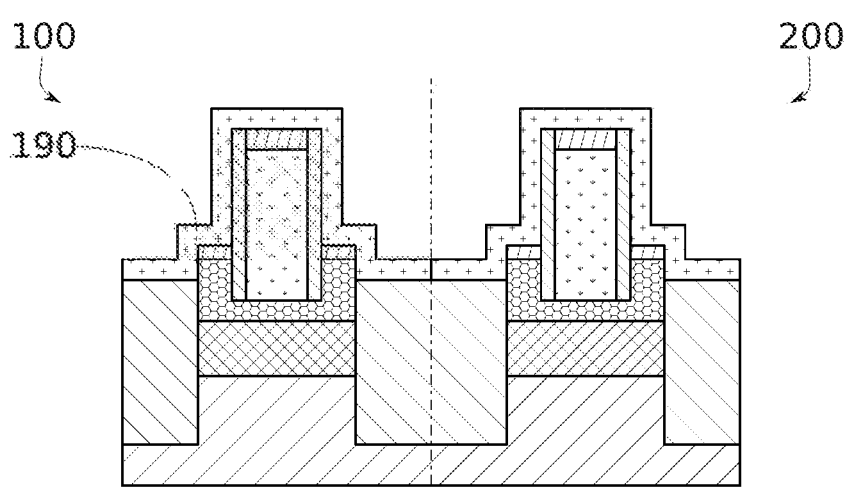

As illustrated in FIG. 3b, the formation of a stressed layer 190 is proceeded with. This stressed layer 190 is preferably tensile stressed. It can be a CESL-type layer (contact etch stop layer). Typically, the stressed layer 190 is a nitride layer. It is, for example, a silicon nitride layer (SixNy x and y being whole numbers). Preferably, the stressed layer 190 is made of SN.

This stressed layer 190 has a thickness of a few nanometers to a few tens of nanometres. Typically, the thickness thereof is between 5 and 40 nm ($10^6$ metes), for example 20 nm.

The formation of the stressed layer comprises a conform deposition. It is, for example, produced by one of the following deposition techniques: plasma-enhanced chemical vapour deposition (PECVD), low-pressure enhanced chemical vapour deposition (LPCVD), rapid thermal CVD (RT-CVD), physical vapour deposition (PVD), atomic layer deposition (ALD). Other types of depositions can be considered.

Preferably, the stressed layer 190 is deposited at a temperature greater than 400° C. and preferably greater than 500° C. According to an embodiment, this temperature corresponds to the temperature to which the support substrate 110 is maintained during the deposition.

Advantageously, his stressed layer 190 partially covers at least the first transistor 100 and partially at least the second transistor 200. Preferably, and as is illustrated in FIG. 3b, all of these transistors are covered by the stressed layer 190. Indeed, preferably a solid wafer deposition is carried out.

Figure 3C:
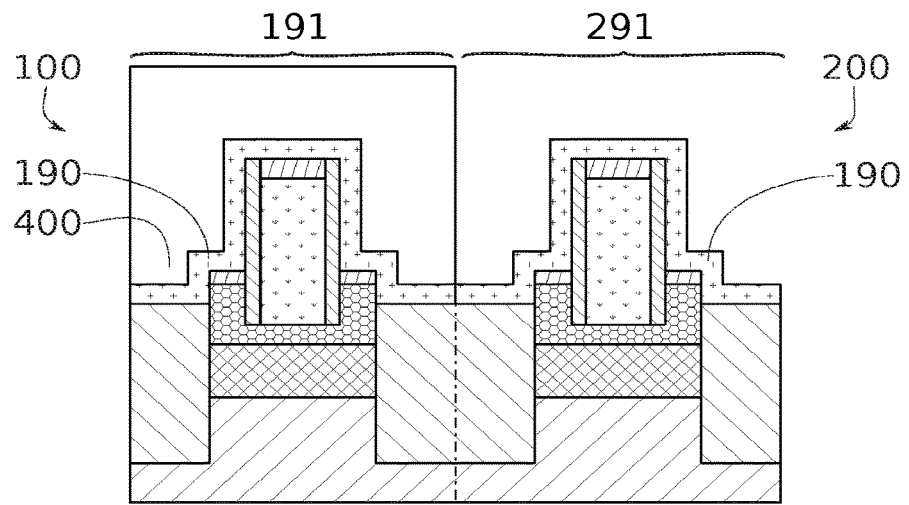
Figure 3D:
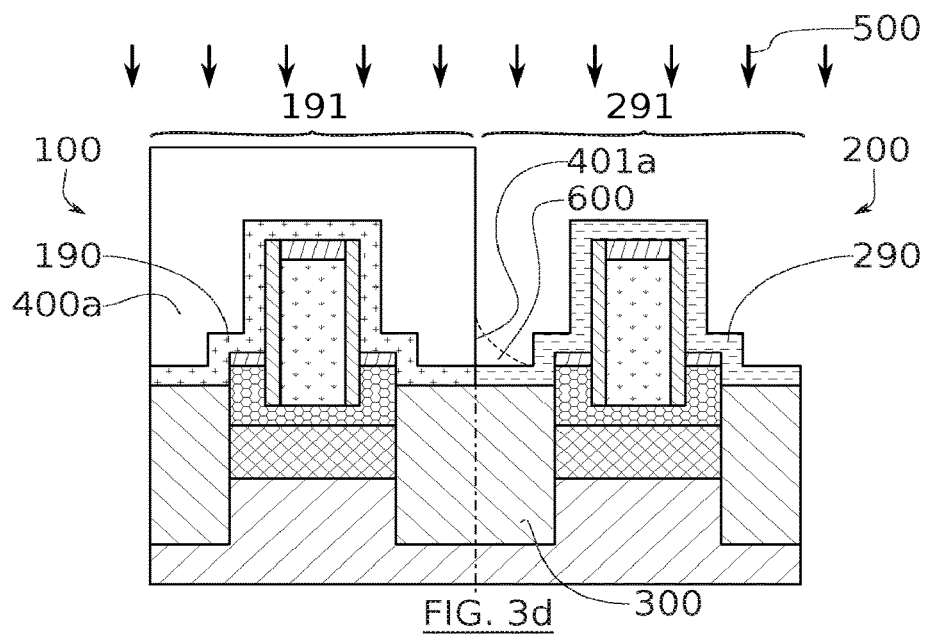

The following step, illustrated in FIG. 3c aims to mask the transistors of one of the two types, the NMOS transistors 100 in this example. To this end, for example, a protective layer 400a can be produced on a first zone 191 of the stressed layer 190, the first zone 191 covering one part at least of the NMOS transistor 100. A second zone 291 of the stressed layer 190 is not covered by the protective layer 400a. This second zone 291 of the stressed layer 190 covers, partially at least and preferably fully, the PMOS transistor 200.

In practice, for each transistor, the zones where the stressed layers contributing to constraining the channel of the transistor are situated around the gate of the transistor (on the top of the gate and on the flanks of the gate) as well as on the source and drain zones close to the gate.

In practice, the transistors of one same type are preferably aligned in the plane of the figures. Therefore, a protective layer 400a is deposited on a set of adjacent transistors of the same type. The stress applied on the channels of these transistors will result in the same method steps. Two transistors of different types are adjacent in a plane perpendicular to that of the figures. However, the representation illustrated in the figures makes it possible to illustrate and to explain the invention, more clearly and concisely.

Preferably, this protective layer 400a is made of resin. It is, for example, produced by solid wafer depositing a photosensitive resin layer, then by defining by lithography, a protective block.

Preferably, the protective layer 400a extends until an insulation trench 300 separating the transistors 100 and 200. Typically, the protective block covering the transistors 100 has a flank 401a facing to the insulation trench 300.

The following step consists of modifying the stressed layer 190 which is not masked (i.e. the second zone 291 of the stressed layer 190) so as to invert the type of stress in this zone 291 of the stressed layer 190. However, during this step, the stress of the first zone 191 of the stressed layer 190 must not be inverted.

To this end, from a plasma, light ions can be implanted in the second zone 291 of the stressed layer. The implantation parameters 500 in particular the energy communicated to the ions, the duration and the implantation dose are provided so as to invert the type of stress in the portions modified by implantation (i.e. the second zone 291 of the stressed layer).

Preferably, this implantation 500 is done solid wafer. The protective layer 400a is configured, in particular the thickness thereof and the type thereof, such that the implantation 500 does not modify the stressed layer 190 in the first zone 191.

Implanted light ions are hydrogen-based ions. The hydrogen (H)-based ions are preferably taken from among the following ions: H, $H^+$, $H_2^+$, $H_3^+$. These ions, called "light" have the advantage of penetrating into the stressed layer 190 without destroying it even without damaging it.

Implantation 500 by plasma has the advantage of making it possible for a continuous implantation 500 in a volume extending from the surface of the implanted layer 190.

Advantageously, the implantation 500 is done such that the implanted ions are distributed in an uninterrupted manner from the surface of the stressed layer 190 and until a desired depth. This distribution has no discontinuity. There are therefore no layers where the implanted species are absent between the surface of the layer 190 and the maximum implantation depth.

This distribution can be homogenous. This leads to a more homogenous stress within the layer 190 than what would have been obtained with conventional implanters. Thus, the stress within the channel of the transistor 200 is best controlled.

Alternatively, this distribution can be non-homogenous. Typically, this distribution will thus decrease from the surface of the layer 190 and until said depth.

Furthermore, the use of a plasma makes it possible for an implantation 500 at shallower depths than the minimum depths that can be obtained with implanters. Thus, an implantation 500 by plasma makes it possible to effectively and relatively homogenously or at the very least continuously implant thin thicknesses. Thus, the layers are avoided being-implanted and therefore altered which are situated under the stressed layer 190, even in the cases where this layer 190 is very thin.

The implantation 500 of a plasma makes it possible to typically implant thicknesses extending from the surface of the implanted layer and over a depth going from 0 nm to 100 nm. Conventional implanters, make it possible for an implantation 500 in a volume of between 30 nm and several hundred nanometers. However, conventional implanters do not make it possible to implant species-between the surface of the layer to be implanted and a depth of 30 nm.

Using a plasma to modify the stressed layer 190 is therefore particularly advantageous when the latter has a low thickness, typically of between 1 and 50 nm and more generally of between 1 and 100 nm.

The modification step carried out from a plasma modifies the silicon nitride-based layer 700 continuously from the surface of this layer and over a depth of between 1 nm and 30 nm and preferably of between 1 nm and 10 nm.

Moreover, using a plasma makes it possible to implant ions with a high anisotropy and with a good precision of the implantation direction. This contributes to improving the control of the implanted zones, and therefore ultimately the compression in the channel of the transistor 200, as well as the interface between tensile stressed zone 191 and the compression stressed zone 291.

Preferably, the implantation 500 is configured so as to make the stressed layer 190 pass from a tensile stress to a compression stress. For this, a person skilled in the art will adjust, in particular, the following parameters:

The thickness of the stressed layer to be modified. The thickness modified at each implantation step will depend on the thickness of the stressed layer. Typically, this modified thickness is of between 1 nm and 100 nm and preferably of between 1 and 6 nm. More generally, the modified thickness will be of a few tens of nanometres typically it will be of between 10 nm and 60 nm, preferably between 25 nm and 45 nm and preferably of around 30 nm.

The power of the source.

The type of gas of which will come from the implanted hydrogen ions.

For example, one of the following gases can be used: $H_2$, HBr, $NH_3$, CxHy (x and y being whole numbers). The advantages associated with each of these gases will be detailed below.

The flow of the gas in the reactor.

The polarisation voltage, usually called bias.

The pressure in the reactor.

The temperature.

The implantation duration.

A person skilled in the art knows how to adjust each of these parameters in order to invert the type of the stress in the stressed layer 190. In particular, the duration of the implantation impacts the dose in the stressed layer 190. A more significant implantation duration leads to a higher-compressive stress.

According to an embodiment, the implantation of hydrogen-based ions is done in a plasma reactor making it possible to control the energy of the ions. It can, for example, be an inductive coupling plasma (ICP) reactor, a capacitive coupling plasma (CCP) reactor, or also an immersion plasma.

Advantageously, the temperature of the wafer during the implantation is less than 150° C.

As indicated above, the hydrogen-based ions come for example from an $H_2$ plasma. This gas makes it possible to avoid the risks of destroying the stressed layer 190.

Alternatively, and as indicated above, the hydrogen-based ions can come from the following gases: $NH_3$ and HBr. Using these gases has the advantage of damaging the stressed layer 190 during the implantation. This makes it possible to adjust the thickness of this layer 190 in the second zone 291, i.e. in this embodiment, to modify the thickness of the stressed layer covering PMOS-type transistors 200. By modifying the thickness of this layer, the stress imposed on the channel of the transistor 200 can thus be adjusted. More generally, the parameters of the plasma can be adjusted, in particular the type of ions and the energy thereof, in order to achieve this result.

Alternatively, and as indicated above, the hydrogen-based ions, can come from a CxHy-type chemistry. It is, for example, a plasma formed from the following gases: $CH_4$ or $CH_4$ and He. This type of gas has the same advantages as the gases $NH_3$ and HBr mentioned above. Furthermore, this type of chemistry makes it possible to limit the consumption of resin from the protective layer 400 during the implantation 500. Indeed, when the protective layer 400a comprises carbon, as is the case when the protective layer 400a is a photosensitive or thermosensitive resin, carbon atoms, coming from the dissociation of CxHy molecules, are deposited on the resin which protects it from the bombardment of the other ions of the plasma such as argon or helium ions, for example. The resin thus conserves, during the whole implantation, the dimensions thereof and the geometry thereof.

This embodiment thus makes it possible to have a particularly high dimensional control of the carbon protective layer. Ultimately, this makes it possible to improve the dimensional control of the zone to be implanted and of the interface between the first and second transistors.

This type of chemistry thus makes it possible to conserve the geometry and the dimensions of the protective layer 400a. This results in the borders between the tensile stressed zones 191 and the compression stressed zones 291 being better controlled.

Advantageously, the implantation by plasma does not generate any creeping of the protective layer 400a or limits the creeping. Conversely, if for the step of modifying the type of stress in the uncovered zone, an exposure to an ultraviolet radiation had been resorted to, which would have required a relatively significant method time, a significant creeping of the protective layer 400a made of resin would have thus been observed. Such a creeping is represented schematically by the reference 600 in FIG. 3d. Such a creeping considerably degrades the dimensional control of the implanted zone. The interface between tensile stressed zones and compression stressed zones is thus no longer controlled with precision, which leads to a degradation in performance of the transistors. By limiting the creeping, the proposed method consequently makes it possible to improve the precision of the interface between tensile stressed zones and compression stressed zones, which leads to an improvement in the performance of the transistors.

Figure 3E:
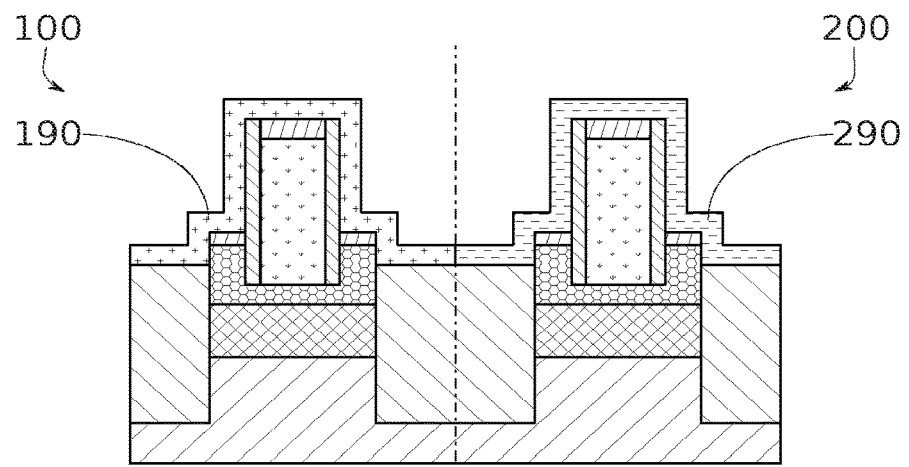

The following step, illustrated in FIG. 3e consists of removing the protective layer 400a. This step is known to a person skilled in the art. It can, for example, be carried out using an oxygen plasma.

Thus, on one same wafer, transistors 100 covered by a tensile stressed layer 190 and other transistors 200 covered by a compression stressed layer 290 are obtained.

To finalise the structure, conventional steps can then be carried out, like for example the opening of the stressed layers 190, 290 at the level of the re-contacts 170, 180, 270, 280 to electrically connect the gate, the sources and the drain.

According to an embodiment, the stressed layer is formed by one single deposition. The modification of the second zone 291 of the stressed layer is obtained by one single step of modification by plasma implantation.

According to an alternative embodiment, the stressed layer is formed by a plurality of successive depositions. After each deposition, or at least after some of them, a step of modification by implantation is carried out. This embodiment makes it possible to have a better control of the modification of the stressed layer. Consequently, the inversion of stress and the amplitude of the stress in the second zone 291 is more specifically controlled. This embodiment also makes it possible to form thick stressed layers, making it possible, due to this, to specifically adjust the tensile-stress in the channel of each of the transistors. For example, at each sequence, a layer of around 10 nm can be deposited, then be modified at the level of the second zone 291.

The conditions below give non-limiting examples to modify the stressed layer over a thickness of between 1 nm and a few tens of nanometres (nm), typically between 1 and 60 nm.

These modifications are made in any type of equipment making it possible to implant hydrogen ions by plasma, while controlling the energy of the implanted ions. ICP-type or CCP-type reactors can thus be resorted to.

Two examples will be given below, according to the chemistry of the plasma used.

Modification Using an $H_2$, HBr or $NH_3$ Type Chemistry
power of the source: 500 to 2000 Watts
type of gas of which will come from the implanted hydrogen ions: $H_2$, HBr, $NH_3$ or a combination of these gases
gas flow: 10 to 500 sccm
polarisation voltage (bias): 100V to 800V
pressure: 5 to 200 milli Torr
temperature: 10° C. to 100° C.
duration: a few seconds to a few minutes.

It will be noted that the window of the method is constrained by steps which will subsequently be carried out. In particular, the conditions mentioned above depend on the temperature which will be applied during later steps.

The conditions below give a non-limiting example to invert the stress of a silicon nitride (SiN) layer, deposited by LPCVD and having a thickness of 20 nm. More specifically, the parameters below make it possible to pass from a tensile stress to a compression stress.

TABLE 1

| | |
|---|---|
| Modified thickness: | 20 nm |
| Chemistry: | $H_2$: 250 sccm |
| Power of the source: | 500 Watts (ICP plasma) |
| Polarisation voltage (bias): | See Table 2 below |
| Pressure: | 80 milli Torr |
| Temperature: | 20-100° C. |
| Time: | 60 seconds |

Table 2 below gives the different stresses that can be obtained, after modification by implantation under the conditions of Table 1, according to:
the initial curve of the wafer. The wafer typically has a diagonal or a diameter of 300 mm.
the polarisation voltage (bias).

TABLE 2

| Polarisation voltage (bias) Voltage (V) | Initial curve | Final curve | Type of stress |
|---|---|---|---|
| 100 V | 28.415 | 11.445 | voltage |
| | 29.874 | 12.355 | |
| | 26.745 | 9.393 | |
| | 24.734 | 7.5331 | |
| 250 V | 34.998 | 7.9724 | |
| | 36.482 | 8.6194 | |
| | 31.49 | 3.8845 | |
| | 34.351 | 6.7323 | |
| 400 V | 28.206 | −5.84 | compression |
| | 32.206 | −2.6227 | |
| | 26.922 | −7.2638 | |
| | 32.23 | −2.3379 | |

It is thus observed, from a polarisation voltage of 400V, the tensile stress of the silicon nitride layer is converted, by implantation, into a compression stress.

Modification Using a CxHy Type Chemistry, x and y being whole Number
power of the source: 0 to 2000 Watts
type of gas of which will come the implanted hydrogen ions: He and $CH_4$ or $H_2$, $CH_4$ and Ar
gas flow:
$H_2$: 50 to 500 sccm
He: 50 to 500 sccm
Ar: 100 to 1000 sccm
$CH_4$: 5 to 15 sccm
polarisation voltage (bias): 20V to 500V
pressure: 5 to 200 milli Torr
temperature: 10° C. to 100° C.
duration: a few seconds to a few minutes.

It will be noted, that the window of the method is broad. The conditions depend on the applications, as well as the thickness of the nitride film to be modified and to be etched. Indeed, the bombardment of ions heavier than hydrogen ions (typically helium or argon ions) leads to etching the nitride layer.

The conditions below give a non-limiting example to invert (passage from a tensile stress to a compression stress) the stress of a silicon nitride (SiN) layer having a thickness of 17 nm.

TABLE 3

| | |
|---|---|
| Modified thickness: | 17 nm |
| Chemistry: | He: 250 sccm |
| | $CH_4$: 10 sccm |
| Power of the source: | 250 W (ICP plasma) |
| Polarisation power (bias): | 250 V |
| Pressure: | 10 milli Torr |
| Temperature: | 20-100° C. |
| Time: | 60 seconds |

Thus, in view of the description above, it clearly appears that the proposed method makes it possible to reduce the cost and make the production of tensile and compression stressed layers more reliable on patterns of a wafer, typically on transistors having different characteristics, for example NMOS and PMOS transistors.

The invention is not limited to the embodiments described above and extends to all the embodiments covered by the claims.

The invention claimed is:

1. A method for producing, on one same wafer, at least one first transistor surmounted at least partially on a tensile stressed layer and a second transistor surmounted at least partially on a compressive stressed layer, the method comprising:
providing a wafer comprising the at least one first transistor and the second transistor;
forming at least one stressed nitride-based layer, on the at least one first transistor and the second transistor, the stressed nitride-based layer being tensile stressed;
depositing a protective layer so as to cover a first zone of the stressed nitride-based layer, the first zone covering at least partially the at least one first transistor and leaving a second zone of the stressed nitride-based layer uncovered, the second zone at least partially covering the second transistor; and
modifying a type of stress of the second zone of the stressed nitride-based layer from a tensile stress to a compressive stress by implanting hydrogen-based ions from a plasma in the second zone, such that the second zone of the stressed nitride-based layer is compressive stressed, the modifying being performed without an exposure to ultraviolet radiation, without an exposure to a laser treatment, and without an exposure to an e-Beam treatment.

2. The method according to claim 1, wherein the depositing is performed so as to cover all of the at least one first transistor, and so as to leave the second transistor fully uncovered.

3. The method according to claim 1, wherein the at least one first transistor and the second transistor are of NMOS-type and PMOS-type, respectively.

4. The method according to claim 1,
wherein the at least one first transistor and the second transistor each have a channel and a gate oxide layer, and
wherein the at least one first transistor and the second transistor have different characteristics taken from among a different channel thickness and a different gate oxide thickness.

5. The method according to claim 1, wherein the plasma is formed from a mixture comprising at least one gas of the following gases: $H_2$, HBr, and $NH_3$.

6. The method according to claim 1, wherein a type of the plasma and an energy of the hydrogen-based ions are selected such that the implanting reduces a thickness of the stressed nitride-based layer in the second zone.

7. The method according to claim 1,
wherein the protective layer comprises carbon, and
wherein the plasma is formed from a mixture comprising at least one gas of CxHy type, where x and y are whole numbers.

8. The method according to claim 7, wherein the plasma is formed from the mixture comprising the at least one gas of CxHy type, where x and y are whole numbers, and from at least one other gas of the following gases: helium (He) and argon (Ar).

9. The method according to claim 1, wherein the forming of the at least one stressed nitride-based layer is performed such that said layer has a thickness of between 2 nm and 50 nm.

10. The method according to claim 1, wherein the forming of the at least one stressed nitride-based layer is performed such that said layer has a thickness of between 5 nm and 40 nm.

11. The method according to claim 1,
wherein the forming of the at least one stressed nitride-based layer comprises a conformal deposition, and
wherein the conformal deposition is performed by one of the following deposition techniques: plasma-enhanced chemical vapour deposition (PECVD), low-pressure enhanced chemical vapour deposition (LPCVD), rapid thermal chemical vapour deposition (RTCVD), and physical vapour deposition (PVD).

12. The method according to claim 1, wherein implantation parameters, including an energy of the hydrogen-based ions, are selected so as to modify, by the implanting, all of a thickness of the second zone of the at least one stressed nitride-based layer.

13. The method according to claim 1, wherein implantation parameters, including an energy of the hydrogen-based ions, are selected so as to modify, by the implanting, the second zone of the at least one stressed nitride-based layer, continuously from a surface of said layer to a depth of about 40 nm.

14. The method according to claim 1, wherein the implanting is performed at a temperature of ≤150° C.

15. The method according to claim 1, wherein the implanting is performed at a temperature of ≤100° C.

16. The method according to claim 1,
wherein the first zone fully covers the at least one first transistor and the second zone fully covers the second transistor,
wherein an electrical insulation trench separates the at least one first transistor and the second transistor, and
wherein an interface defined by the first zone and the second zone is disposed so as to at least partially face the electrical insulation trench.

17. The method according to claim 1, further comprising a plurality of sequences, each sequence of said plurality being applied on the at least one first transistor and the second transistor, and said each sequence comprising successively at least: the step of forming the at least one stressed nitride-based layer, the step of depositing the protective layer, and the step of modifying the type of stress.

18. The method according to claim 17, wherein at said each sequence, the step of forming the at least one stressed nitride-based layer is configured such that a thickness of said layer is less than 20 nm.

19. The method according to claim 17, wherein at said each sequence, the step of forming the at least one stressed nitride-based layer is configured such that a thickness of said layer is between 5 nm and 15 nm.

20. The method according to claim 1,
wherein the at least one first transistor and the second transistor each have a channel formed in a semi-conductive layer, which surmounts a dielectric layer and a support substrate, and
wherein the semi-conductive layer, the dielectric layer, and the support substrate form a semi-conductor on insulator-type substrate, of FDSOI-type.

21. A method for producing, on one same wafer, at least one first transistor surmounted at least partially on a tensile stressed layer and a second transistor surmounted at least partially on a compressive stressed layer, the method comprising:

providing a wafer comprising the at least one first transistor and the second transistor;
forming at least one stressed nitride-based layer, on the at least one first transistor and the second transistor, the stressed nitride-based layer being tensile stressed;
depositing a protective layer so as to cover a first zone of the stressed nitride-based layer, the first zone covering at least partially the at least one first transistor and leaving a second zone of the stressed nitride-based layer uncovered, the second zone at least partially covering the second transistor; and
modifying a type of stress of the second zone of the stressed nitride-based layer from a tensile stress to a compressive stress by implanting hydrogen-based ions from a plasma in the second zone, such that the second zone of the stressed nitride-based layer is compression stressed,
wherein the implanting is performed at a temperature of ≤150° C., and
wherein there is no post-implant annealing.

* * * * *